United States Patent
Shin et al.

(10) Patent No.: US 10,964,395 B2
(45) Date of Patent: Mar. 30, 2021

(54) MEMORY SYSTEM, MEMORY DEVICE AND MEMORY CONTROLLER

(71) Applicant: SK hynix Inc., Icheon-si (KR)

(72) Inventors: Seung-Hwan Shin, Seongnam-si (KR); Woong-Sik Shin, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/707,959

(22) Filed: Dec. 9, 2019

(65) Prior Publication Data
US 2020/0321056 A1    Oct. 8, 2020

(30) Foreign Application Priority Data

Apr. 4, 2019 (KR) .................. 10-2019-0039823

(51) Int. Cl.
| | |
|---|---|
| *G11C 7/00* | (2006.01) |
| *G11C 16/10* | (2006.01) |
| *G11C 16/32* | (2006.01) |
| *G11C 16/04* | (2006.01) |

(52) U.S. Cl.
CPC .......... *G11C 16/10* (2013.01); *G11C 16/0483* (2013.01); *G11C 16/32* (2013.01)

(58) Field of Classification Search
CPC ....... G11C 7/22; G11C 7/222; G11C 11/4076; G11C 7/1051; G11C 7/1066
USPC .................................................. 365/194, 201
See application file for complete search history.

(56) References Cited

U.S. PATENT DOCUMENTS

2017/0315879 A1* 11/2017 Park .................... G06F 11/0766
2018/0076833 A1*  3/2018 Akamine ................ G06F 13/24

FOREIGN PATENT DOCUMENTS

| KR | 10-2011-0119328 | 11/2011 |
|---|---|---|
| KR | 10-2017-0065076 | 6/2017 |
| KR | 10-2020-0126563 | 11/2020 |

* cited by examiner

*Primary Examiner* — Son T Dinh
(74) *Attorney, Agent, or Firm* — Perkins Coie LLP

(57) ABSTRACT

A memory system, a memory device, a memory controller and an operating method thereof. By issuing a first status check signal when a first delay time elapses since a first point in time at which a program operation for first memory cells corresponding to a first word line is started and by issuing a second status check signal when a second delay time different from the first delay time elapses since a second point in time at which a program operation for second memory cells corresponding to a second word line is started, it is possible to efficiently perform a status check operation related with a program operation of data.

20 Claims, 19 Drawing Sheets

MEMORY SYSTEM, MEMORY DEVICE AND MEMORY CONTROLLER

CROSS-REFERENCE TO RELATED APPLICATION

This patent document claims the priority and benefits of Korean Patent Application No. 10-2019-0039823 filed on Apr. 4, 2019, which is incorporated herein by reference in its entirety.

TECHNICAL FIELD

Various embodiments generally relate to a memory system, a memory device and a memory controller.

BACKGROUND

A memory system including data storage device is used for storing and extracting data files. It can store data temporarily or persistently based on a request of a computer, server, mobile device (e.g., smartphone, tablet), or any similar computing device. The examples of the memory system span from a traditional hard disk drive (HDD) to a semiconductor-based data storage such as a solid state drive (SSD), a universal flash storage (UFS) device, and an embedded MMC (eMMC) device.

The SSD, UCF, and eMMC include nonvolatile memory devices such as a ROM (read only memory), a PROM (programmable ROM), an EPROM (electrically programmable ROM), an EEPROM (electrically erasable and programmable ROM), a flash memory, a PRAM (phase-change RAM), an MRAM (magnetic RAM), an RRAIVI (resistive RAM), and an FRAM (ferroelectric RAM).

The memory system may further include a memory controller for controlling a memory device. The memory controller may receive a command from the host to perform read and write operations on the memory devices included in the memory system.

SUMMARY

The technology disclosed in this patent document can be implemented in various embodiments to provide a memory system, a memory device, and a memory controller that can avoid long idle time on the system bus during program (write) operations.

In some embodiments, a memory system, a memory device, and a memory controller can efficiently perform a status check operation associated with a program operation.

In some embodiments, a memory system, a memory device, and a memory controller performs a status check operation associated with a program operation based on the characteristics of word lines in a memory device.

In one aspect, embodiments may provide a memory system including a memory device including a plurality of memory cells arranged in an array coupled to a plurality of word lines and a plurality of bit lines, and a memory controller configured to control the memory device.

The plurality of word lines may include a first word line and a second word line.

The memory controller may be configured to issue a first status check signal to the memory device when a first delay time elapses since a first point in time at which a program operation for first memory cells coupled to the first word line is started. The first status check signal is used to check as to whether the program operation associated with the first word line has been completed.

The memory controller may be configured to issue a second status check signal to the memory device when a second delay time different from the first delay time elapses since a second point in time at which a program operation for second memory cells coupled to the second word line is started. The second status check signal is used to check as to whether the program operation associated with the second word line has been completed.

A first program time for writing data in the first memory cells coupled to the first word line and a second program time for writing data in the second memory cells coupled to the second word line may be different from each other.

The second program time may be longer than the first program time, and the second delay time may be longer than the first delay time.

The first word line and the second word line may be disposed in the same memory block. Alternatively, the first word line and the second word line may be disposed in different memory blocks arranged in different locations in the memory device.

The plurality of word lines may further include a third word line and a fourth word line, and in this case, the memory controller may output the status check signal when a third delay time elapses since a third point in time at which a program operation for third memory cells coupled to the third word line is started. Further, the memory controller may output the status check signal when a fourth delay time different from the third delay time elapses since a fourth point in time at which a program operation for fourth memory cells coupled to the fourth word line is started.

The third delay time may correspond to the first delay time, and the fourth delay time may correspond to the second delay time.

A third program time for writing data in the third memory cells coupled to the third word line and a fourth program time for writing data in the fourth memory cells coupled to the fourth word line may be different from each other.

A difference between the first program time and the third program time may be smaller than a difference between the first program time and the second program time.

A difference between the second program time and the fourth program time may be smaller than a difference between the second program time and the third program time.

The first word line, the second word line, the third word line and the fourth word line may be disposed in the same first memory block.

Alternatively, the first word line and the third word line may be disposed in a first memory block, and the second word line and the fourth word line may be disposed in a second memory block of which a position is different from that of the first memory block.

In another aspect, embodiments may provide a memory controller including a host interface configured to communicate with a host, a memory interface configured to communicate with a memory device including a plurality of memory cells arranged in an array coupled to a plurality of word lines and a plurality of bit lines, and a control circuit configured to control the memory device.

The control circuit may be configured to issue a first status check signal to the memory device when a first delay time elapses since a first point in time at which a program operation for first memory cells coupled to a first word line among the plurality of word lines is started.

The control circuit may be configured to issue a second status check signal to the memory device when a second delay time different from the first delay time elapses since a second point in time at which a program operation for second memory cells coupled to a second word line different from the first word line among the plurality of word lines is started.

In still another aspect, embodiments may provide a memory device including a plurality of word lines, a plurality of bit lines arranged in rows and columns, and a plurality of memory cells coupled the plurality of word lines and the plurality of bit lines.

The plurality of word lines may include a first word line and a second word line, and a first delay time from a point of time at which programming of data for first memory cells corresponding to the first word line is started to when a status check signal is received from a memory controller and a second delay time from a point of time at which programming of data for second memory cells corresponding to the second word line is started to when the status check signal is received from the memory controller may be different from each other.

In yet another aspect, embodiments may provide a method for operating a memory controller, including: starting programming of data for first memory cells corresponding to a first word line among a plurality of word lines in a memory device, at a first point of time; outputting a status check signal to the memory device after a first delay time from the first point of time; starting programming of data for second memory cells corresponding to a second word line different from the first word line among the plurality of word lines, at a second point of time; and outputting the status check signal to the memory device after a second delay time different from the first delay time from the second point of time.

In still yet another aspect, embodiments may provide a method for operating a memory controller, including: storing and managing a program time for each word line or each word line group in a memory device; and independently controlling status check timing for checking whether programming of the memory device is being performed or is ended, for each word line or each word line group, based on the program time for each word line or each word line group.

In a further aspect, embodiments may provide a method for operating a memory controller, including: storing and managing a program time for each memory block in a memory device; and independently controlling status check timing for checking whether programming of the memory device is being performed or is ended, for each memory block, based on the program time for each memory block.

In some embodiments of the disclosed technology, a memory system may include a memory device including a plurality of memory cells arranged in an array coupled to a plurality of word lines and a plurality of bit lines and a memory controller in communication with the memory device to control the memory device. The plurality of word lines includes a first word line and a second word line. The memory controller is configured to issue a first status check signal to the memory device when a first delay time elapses since a first point in time at which a program operation for first memory cells coupled to the first word line is started, wherein the first status check signal is used to check as to whether the program operation associated with the first word line has been completed. The memory controller is configured to issue a second status check signal to the memory device when a second delay time different from the first delay time elapses since a second point in time at which a program operation for second memory cells coupled to the second word line is started, wherein the second status check signal is used to check as to whether the program operation associated with the first word line has been completed.

In some embodiments of the disclosed technology, a memory controller includes a host interface configured to communicate with a host, a memory interface configured to communicate with a memory device including a plurality of memory cells arranged in an array coupled to a plurality of word lines and a plurality of bit lines, and a control circuit configured to control the memory device based on an adaptive status check timing control scheme. The adaptive status check timing control scheme is implemented by grouping the plurality of memory cells into a plurality of memory cell groups based on grouping of word lines coupled to the memory cells such that program times for the memory cells vary from one word line group to another word line group, and issuing status check signals at timings that vary depending on program times associated with the word line groups to check as to whether a program operation associated with each word line group has been completed.

Embodiments may provide a memory system, a memory device and a memory controller, capable of efficiently managing a program (write) operation of data.

Also, embodiments may provide a memory system, a memory device and a memory controller, capable of efficiently performing a status check operation related with a program operation of data.

Further, embodiments may provide a memory system, a memory device and a memory controller, capable of effectively controlling a status check operation related with a program operation of data, in consideration of the characteristics of word lines in a memory device.

Moreover, embodiments may provide a memory system, a memory device and a memory controller, capable of causing a status check operation related with a program operation of data to be performed quickly.

In addition, embodiments may provide a memory system, a memory device and a memory controller, capable of preventing a status check operation related with a program operation of data from being unnecessarily performed repeatedly.

DETAILED DESCRIPTION

Figure 1:
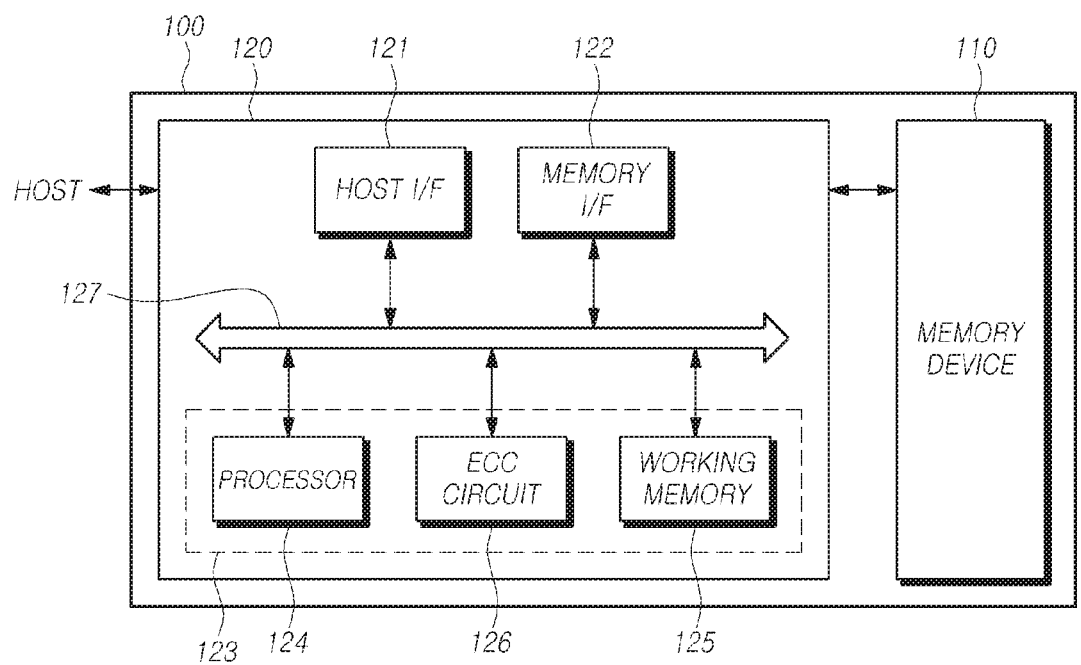
FIG. 1 shows an example of a memory system based on some embodiments of the disclosed technology.

In the disclosure, advantages, features and methods for achieving the advantages and features will become more apparent after a reading of the following embodiments taken in conjunction with the accompanying drawings. The disclosure may, however, be embodied in different forms and should not be construed as being limited to the embodiments set forth herein. Rather, these embodiments of the disclosure are provided to describe the present disclosure in detail to the extent that a person skilled in the art to which the disclosure pertains can easily carry out the technical ideas of the present disclosure.

It is noted that reference to "an embodiment," "another embodiment" or the like does not necessarily mean only one embodiment, and different references to any such phrase are not necessarily to the same embodiment(s).

It is to be understood herein that embodiments of the disclosure are not limited to the particulars shown in the drawings and that the drawings are not necessarily to scale and in some instances proportions may have been exaggerated in order to more clearly depict certain features of the disclosure. Like reference numerals denote like elements throughout the drawings and the description.

While particular terminology is used herein, it is to be appreciated that the terminology used herein is for the purpose of describing particular embodiments of the disclosure only and is not intended to limit the scope of the embodiments of the disclosure.

Specific structural or functional descriptions related to embodiments according to the disclosure and disclosed in the present specification or application are merely illustrated to describe embodiments of the disclosure. The embodiments of the disclosure may be implemented in various forms and should not be interpreted as being limited to the embodiments described in the present specification or application.

The embodiments according to the disclosure may be modified in various manners and may have various forms, so that specific embodiments are intended to be illustrated in the drawings and described in detail in the present specification or application. However, it should be understood that those embodiments are not intended to limit the embodiments based on the concept of the disclosure to specific disclosure forms and the embodiments include all changes, equivalents or modifications included in the spirit and scope of the disclosure.

As used herein, the term "and/or" includes any and all combinations of one or more of the associated listed items. The terms such as "first" and "second" may be used to describe various components, but those components should not be limited by the terms. The terms are merely used to distinguish one component from other components. For example, a first component may be designated as a second component and a second component may be designated as a first component in the similar manner, without departing from the scope based on the concept of the disclosure.

It will be understood that, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other representations describing relationships among components, that is, "between" and "directly between" or "adjacent to," and "directly adjacent to," should be interpreted in a similar manner.

A singular expression includes a plural expression unless a description to the contrary is specifically pointed out in context. The articles 'a' and 'an' as used in this application and the appended claims should generally be construed to mean 'one or more' unless specified otherwise or clear from context to be directed to a singular form. In the present specification, it should be understood that the terms such as "include" or "have" are merely intended to indicate that features, numbers, steps, operations, components, parts, or combinations thereof are present, and are not intended to exclude a possibility that one or more other features, numbers, steps, operations, components, parts, or combinations thereof will be present or added.

Unless differently defined, all terms used herein, including technical or scientific terms, have the same meanings as the terms generally understood by those skilled in the art to which the disclosure pertains. The terms identical to those defined in generally used dictionaries should be interpreted as having meanings identical to contextual meanings of the related art, and are not interpreted as being ideal or excessively formal meanings unless the terms are defined in the present specification.

Detailed description of well-known functions and structures incorporated herein may be omitted to avoid obscuring the subject matter of the disclosure. This aims to omit unnecessary description so as to make the subject matter of the disclosure clearer.

Also, in describing the components of the embodiments of the disclosure, there may be terms used like first, second, A, B, (a), and (b). These are solely for the purpose of differentiating one component from the other but do not imply or suggest the substances, order or sequence of the components. If a component is described as "connected," "coupled", or "linked" to another component, it may mean that the component is not only directly "connected," "coupled", or "linked" but also is indirectly "connected," "coupled", or "linked" via a third component.

Various embodiments will be described below with reference to the accompanying drawings, to describe embodiments of the disclosure in detail to the extent that a person skilled in the art can easily carry out the technical idea of the embodiments of the disclosure.

The embodiments of the disclosed technology relate to a memory system that can avoid long idle time on the system bus during program operations by grouping memory devices on a program time (tPRG) basis. Different memory devices may have different tPRG times. In operation, word line groups with short tPRG memory devices can complete their program operations when word line groups with long tPRG memory devices are still performing program operations. This use of grouping different memory devices based on different program times or tPRG values and the associated writing operations based on the grouping enable a faster operation in writing data.

FIG. 1 shows an example of a memory system 100 based on some embodiments of the disclosed technology.

In an implementation, the memory system 100 may include a memory device 110, which stores data, and a memory controller 120, which controls the memory device 110.

The memory device 110 includes a memory cell array and the memory controller 120 performs memory operations on the memory cell array. Examples of the memory operations may include a read operation, a program operation (also referred to as a write operation) and an erase operation.

The memory cell array includes a plurality of memory cells for storing data. In some implementations, a predetermined number of memory cells constitute a memory block.

In some implementations, the memory device 110 may be implemented with a DDR SDRAM (double data rate synchronous dynamic random access memory), an LPDDR4 (low power double data rate 4) SDRAM, a GDDR (graphics double data rate) SDRAM, an LPDDR (low power DDR), an RDRAM (Rambus dynamic random access memory), a NAND flash memory, a vertical NAND flash memory, a NOR flash memory, a resistive random access memory (RRAM), a phase-change memory (PRAM), a magnetoresistive random access memory (MRAM), a ferroelectric random access memory (FRAM) or a spin transfer torque random access memory (STT-RAM).

The memory device 110 may have a three-dimensional array structure. In an implementation, the memory device 110 may be a flash memory using a conductive floating gate as a charge storage layer. In another implementation, the memory device 110 may be a flash memory using, as the charge storage layer, a charge trap flash (CTF), which is formed of a dielectric layer.

The memory device 110 is configured to receive a command and an address from the memory controller 120 and access a region selected by the address in the memory cell array. In other words, the memory device 110 may perform an operation requested by the command and perform the operation for a region selected by the address.

In an implementation where the memory device 110 includes flash memory devices, and can be operated to perform a program operation, a read operation, and an erase operation. In the program operation, the memory device 110 may write data in a region of the memory cell array selected by the address. In the read operation, the memory device 110 may read data from a region of the memory cell array selected by the address. In the erase operation, the memory device 110 may erase data stored in a region of the memory cell array selected by the address.

The memory controller 120 may control the operation of the memory device 110 according to a request of a host or regardless of a request of the host.

For example, the memory controller 120 may control write (program), read, erase, and background operations for the memory device 110. For example, the background operation may include a garbage collection (GC) operation, a wear leveling (WL) operation, a bad block management (BBM) operation, or the like.

As shown in FIG. 1, the memory controller 120 may include a host interface 121, a memory interface 122, and a control circuit 123.

The host interface 121 provides an interface for communication with the host. The control circuit 123 may receive a command from the host through the host interface 121 and control execution of the received command.

The memory interface 122 provides an interface for communication between the memory device 110 and other components of the memory system 100. For example, the memory interface 122 may be configured to provide the interface between the memory device 110 and the memory controller 120 in performing memory operations based on internal control signals of the control circuit 123.

The control circuit 123 performs the general control operations of the memory controller 120, thereby controlling the operations of the memory device 110. In an implementation, the control circuit 123 may include at least one of a processor 124 and a working memory 125. In another implementation, the control circuit 123 may further include an error detection and correction circuit (ECC circuit) 126.

The processor 124 may control general operations of the memory controller 120, and may perform a logic calculation. The processor 124 may communicate with the host through the host interface 121, and may communicate with the memory device 110 through the memory interface 122.

The processor 124 may perform the function of a flash translation layer (FTL). The processor 124 may convert a logical block address (LBA) provided by the host, into a physical block address (PBA), through the flash translation layer FTL. The flash translation layer (FTL) may receive the logical block address (LBA) and translate it into the physical block address (PBA), by using a mapping table. There are various address mapping methods of the flash translation layer, depending on a mapping unit. Examples of address mapping methods include a page mapping method, a block mapping method and a hybrid mapping method.

In some implementations, the processor 124 is configured to randomize data received from the host. For example, the processor 124 may randomize data received from the host, by using a randomizing seed. Randomized data as data to be stored is provided to the memory device 110 and is programmed to the memory cell array.

In some implementations, the processor 124 is configured to derandomize data received from the memory device 110, in a read operation. For example, the processor 124 may derandomize data received from the memory device 110, by using a derandomizing seed. Derandomized data may be outputted to the host.

In some implementations, the processor 124 may control the operation of the memory controller 120 by executing firmware operations. In order to control general operations of the memory controller 120 and perform a logic calculation, firmware is loaded to the working memory 125 upon booting, and the processor 124 executes the firmware operations. For instance, the firmware may be stored in the memory device 110 and be loaded to the working memory 125.

In some implementations, the firmware is software that is installed on a memory to provide a control for the memory system 100. Examples of the firmware associated with the memory system 100 may include a flash translation layer (FTL), which performs a translation function between a logical address requested to the memory system 100 by the host and a physical address of the memory device 110, a host interface layer (HIL), which serves to analyze a command requested to the memory system 100 by the host and provides the command to the flash translation layer (FTL), and a flash interface layer (FIL), which provides a command instructed from the flash translation layer (FTL) to the memory device 110.

The working memory 125 may store firmware files, program codes, commands and data dedicated to performing the operations of the memory controller 120.

In an implementation, the working memory 125 may include at least one of an SRAM (static RAM), a DRAM (dynamic RAM) and an SDRAM (synchronous DRAM).

The error detection and correction circuit 126 may be configured to detect and correct one or more erroneous bits in the data stored in the working memory 125 (e.g., read data transferred from the memory device 110) by using an error detection code and error correction code.

The error detection and correction circuit 126 may be configured to decode data by using an error correction code. The error detection and correction circuit 126 may be realized by various decoding schemes. For example, at least one of unsystematic code decoding schemes or systematic code decoding schemes may be used.

In some implementations, the error detection and correction circuit 126 may detect one or more erroneous bits on a sector basis. In some implementations, program (write) operations and read operations are performed on a page basis, and erase operations are performed on a block basis. The sector, page, and block are units of memory space, and the sector is a smaller unit compared to the page. Sectors constituting each read data may correspond to different addresses.

In an implementation, the error detection and correction circuit 126 may calculate a bit error rate (BER). The error detection and correction circuit 126 may determine whether an error is correctable or not on a sector basis. For example, in the case where a bit error rate (BER) is higher than a predetermined threshold value, the error detection and correction circuit 126 may determine that a corresponding sector is uncorrectable. On the other hand, in the case where a bit error rate (BER) is lower than the reference value, the error detection and correction circuit 126 may determine that a corresponding sector is correctable.

The error detection and correction circuit 126 may perform an error detection and correction operation sequentially for all read data. In the case where a sector included in read data is correctable, the error detection and correction circuit 126 may omit an error detection and correction operation for a corresponding sector for next read data. If the error detection and correction operation for all read data is ended in this way, the error detection and correction circuit 126 may detect an uncorrectable sector. The error detection and correction circuit 126 may provide the associated error information (e.g., address of uncorrectable sector) to the processor 124.

A bus 127 may be configured to provide channels between the components 121, 122, 124, 125 and 126 of the memory controller 120. The bus 127 may include a control bus for transferring control signals such as commands and a data bus for transferring data.

The above-described components 121, 122, 124, 125 and 126 of the memory controller 120 are only examples to facilitate an understanding of the disclosed technology. The components 121, 122, 124, 125 and 126 may be selectively included in the memory controller 120 or part of the components 121, 122, 124, 125 and 126 may be omitted.

Figure 2:
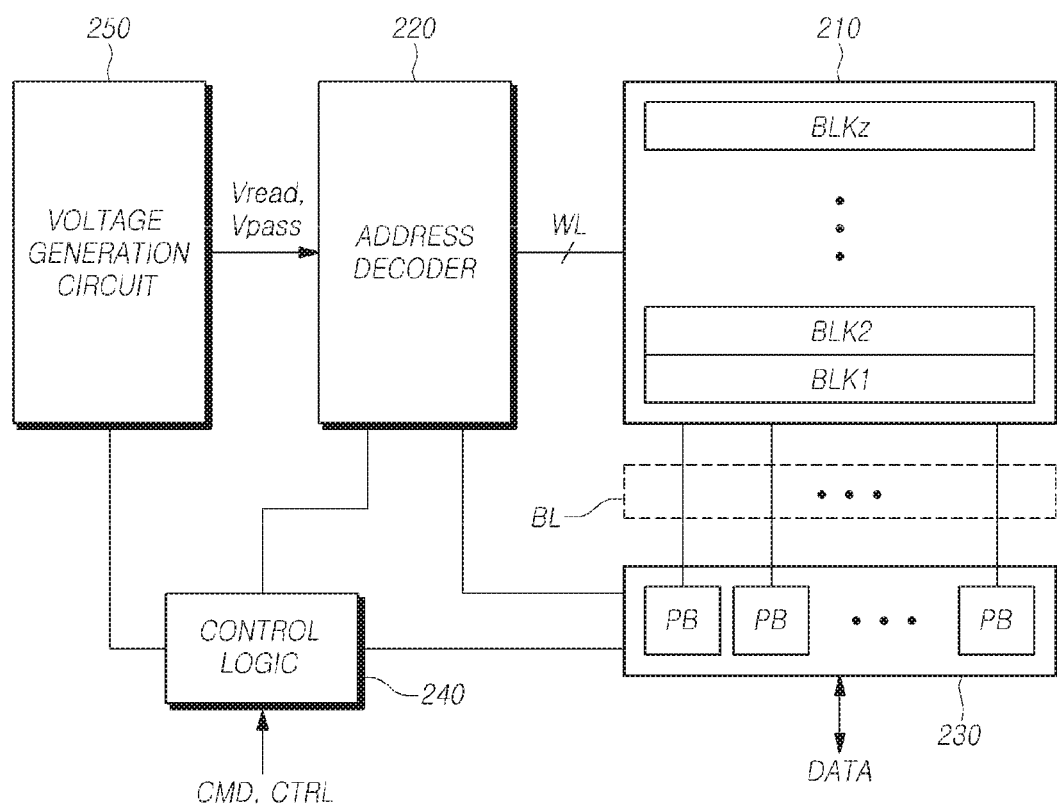
FIG. 2 shows an example of a memory device based on some embodiments of the disclosed technology.

FIG. 2 shows an example of the memory device 110 based on some embodiments of the disclosed technology.

In an implementation, the memory device 110 may include a memory cell array 210, an address decoder 220, a read and write circuit 230, a control logic 240, and a voltage generation circuit 250.

The memory cell array 210 may include a plurality of memory blocks BLK1 to BLKz (z is a natural number of 2 or greater).

In the plurality of memory blocks BLK1 to BLKz, a plurality of memory cells (MC), a plurality of word lines WL and a plurality of bit lines BL may be arranged in rows and columns.

The plurality of memory blocks BLK1 to BLKz may be coupled to the address decoder 220 through the plurality of word lines WL. The plurality of memory blocks BLK1 to BLKz may be coupled to the read and write circuit 230 through the plurality of bit lines BL.

Each of the plurality of memory blocks BLK1 to BLKz may include a plurality of memory cells. For example, the plurality of memory cells may be nonvolatile memory cells. In some implementations, such nonvolatile memory cells may have vertical channel structures. The memory cell array 210 may be arranged in a two-dimensional structure or a three-dimensional structure.

Each of the plurality of memory cells included in the memory cell array may store at least 1-bit of data. For instance, each of the plurality of memory cells included in the memory cell array 210 may be a single level cell (SLC) which stores 1-bit data. Each of the plurality of memory cells included in the memory cell array 210 may be a multi-level cell (MLC) which stores 2-bit data. Each of the plurality of memory cells included in the memory cell array 210 may be a triple level cell (TLC) which stores 3-bit data. Each of the plurality of memory cells included in the memory cell array 210 may be a quad level cell (QLC) which stores 4-bit data. The memory cell array 210 may include a plurality of memory cells each of which stores 5 or more-bit data.

As shown in FIG. 2, the address decoder 220, the read and write circuit 230, the control logic 240 and the voltage generation circuit 250 may operate as peripheral circuits that are used to control an operation of the memory cell array 210.

The address decoder 220 may be coupled to the memory cell array 210 through the plurality of word lines WL. The address decoder 220 may be used to select one or more of the word lines WL based on the address, and the control logic 240 may control such operations. The address decoder 220 may receive an address through an input/output buffer (not shown) in the memory device 110.

The address decoder 220 may be configured to decode the received address to obtain a block address. The address decoder 220 may select at least one memory block based on the decoded block address. The address decoder 220 may apply a read voltage Vread generated by the voltage generation circuit 250 to a selected word line in a selected memory block during a read operation, and may apply a pass voltage Vpass to the remaining unselected word lines. Further, the address decoder 220 may apply a verify voltage generated by the voltage generation circuit 250 to a selected word line in a selected memory block during a program verify operation, and may apply a pass voltage Vpass to the remaining unselected word lines.

The address decoder 220 may be configured to decode the received address to obtain a column address. The address decoder 220 may provide the decoded column address to the read and write circuit 230.

A read operation and a program operation of the memory device 110 may be performed on a page basis. An address that is received for a read operation or a program operation may include a block address, a row address, and a column address.

The address decoder 220 may select one memory block and one word line based on a block address and a row address. A column address may be obtained from the address decoder 220 and be provided to the read and write circuit 230.

The address decoder 220 may include at least one of a block decoder, a row decoder, a column decoder, and an address buffer.

The read and write circuit 230 may include a plurality of page buffers PB. The read and write circuit 230 may operate as a read circuit in a read operation of the memory cell array 210, and may operate as a write circuit in a write operation of the memory cell array 210.

The read and write circuit 230 described above may include a page buffer circuit or a data register circuit. For example, the data register circuit may include a data buffer for holding data, and may further include a cache buffer for performing a caching function.

The plurality of page buffers PB may be coupled to the memory cell array 210 through the plurality of bit lines BL. The plurality of page buffers PB may continuously supply sensing current to bit lines coupled to memory cells to sense the threshold voltages (Vth) of the memory cells for a read operation and a program verify operation, and may latch sensing data by sensing, through sensing nodes, changes in the current flowing through a selected bit line that varies depending on the programmed states of the corresponding memory cells. The read and write circuit 230 may operate based on page buffer control signals provided by the control logic 240.

In a read operation, the read and write circuit 230 temporarily stores read data by sensing the threshold voltages (Vth) of memory cells, and then outputs data DATA to the input/output buffer of the memory device 110. As an exemplary embodiment, the read and write circuit 230 may include a column select circuit in addition to the page buffers (or page registers).

The control logic 240 may be in communication with the address decoder 220, the read and write circuit 230 and the voltage generation circuit 250. The control logic 240 may receive a command CMD and a control signal CTRL through the input/output buffer of the memory device 110.

The control logic 240 may be configured to control general operations of the memory device 110 based on the control signal CTRL. Further, the control logic 240 may output a control signal for adjusting the precharge potential levels of the sensing nodes of the plurality of page buffers PB.

The control logic 240 may control the read and write circuit 230 to perform a read operation of the memory cell array 210.

The voltage generation circuit 250 may generate the read voltage Vread and the pass voltage Vpass in a read operation in response to a voltage generation circuit control signal outputted from the control logic 240.

Figure 3:
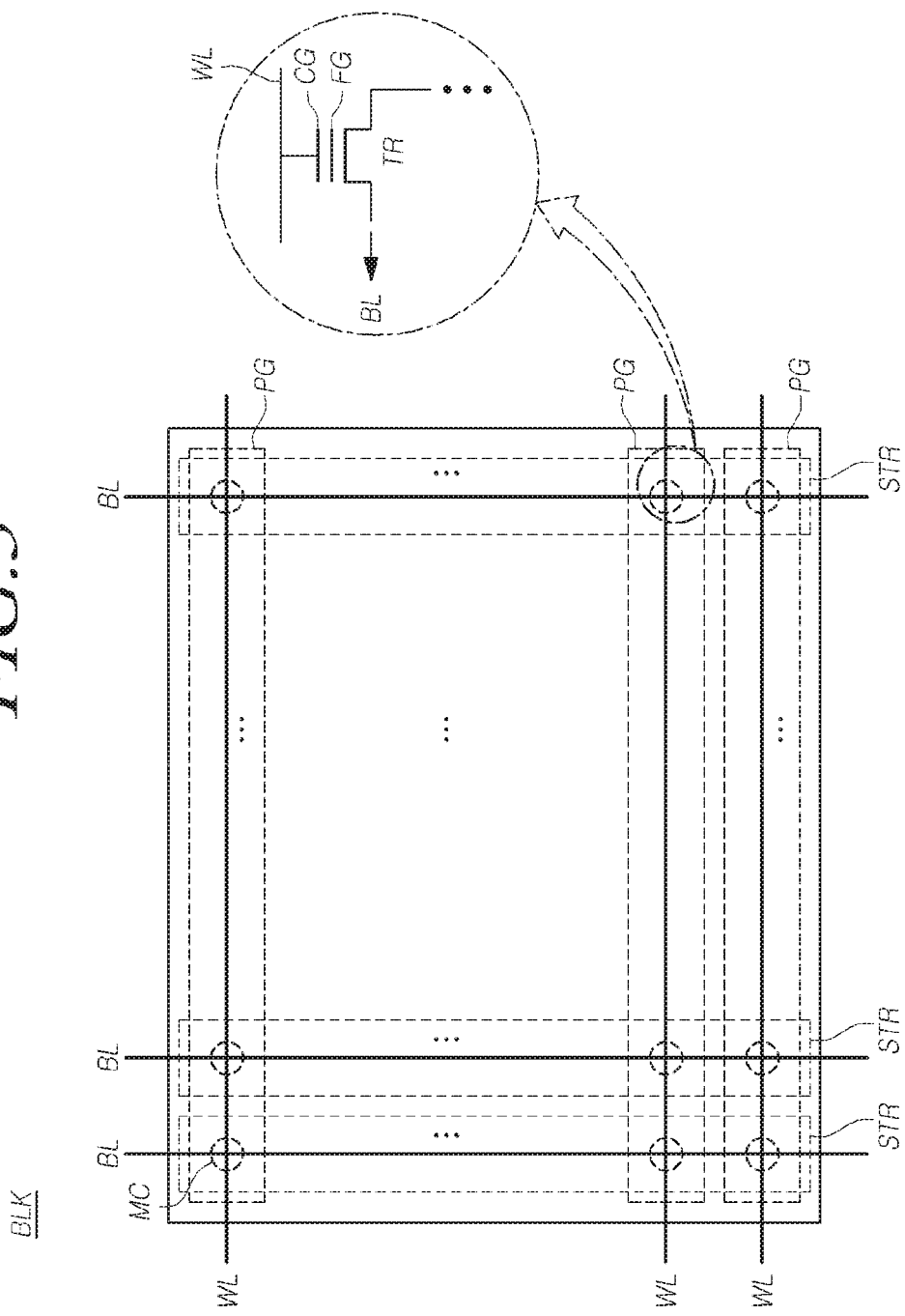
FIG. 3 shows an example of a memory block of the memory device based on some embodiments of the disclosed technology.

FIG. 3 shows an example of one of the plurality of memory blocks BLK1 to BLKz of the memory device 110 based on some embodiments of the disclosed technology.

In an implementation where the memory device 110 is a NAND flash memory, NAND flash cells are joined together in strings and arrays to form larger data storage structures. A predetermined number of strings are joined together to form each of the plurality of memory blocks BLK1 to BLKz included in the memory device 110. A word line connects to all memory cells in the same position in the strings and defines a page PG within the memory block.

All the strings STR in the array are connected at one end to a common source line and at the other end to each of a plurality of bit lines BL.

In each of the plurality of memory blocks BLK1 to BLKz, the plurality of word lines WL intersects the strings STR at each memory cell and the plurality of bit lines BL is coupled to the plurality of bit lines BL, respectively. In some implementations, each of the plurality of word lines WL may be disposed in a row (or column) direction, and each of the plurality of bit lines BL may be disposed in a column (or row) direction.

Each memory cell MC may include a transistor TR. For example, the transistor TR of each memory cell MC may include a drain, a source, and a gate. The drain (or the source) of the transistor TR may be connected directly or coupled indirectly via one or more other transistors TR to a corresponding bit line, the source (or the drain) of the transistor TR may be connected directly or coupled indirectly via one or more other transistors to a source line (which may be the ground), and the gate of the transistor TR may include a floating gate FG surrounded by a dielectric and a control gate CG to which a gate voltage is applied.

As shown in FIG. 3, in each of the plurality of memory blocks BLK1 to BLKz, a first select line (e.g., a source select line or a drain select line) may be arranged outside a first outermost word line adjacent to the read and write circuit 230 between two outermost word lines, and a second select line (e.g., a drain select line or a source select line) may be arranged outside a second outermost word line.

In some implementations, at least one dummy word line may be additionally disposed between the first outermost word line and the first select line. At least one dummy word line may also be additionally disposed between the second outermost word line and the second select line.

Figure 4:
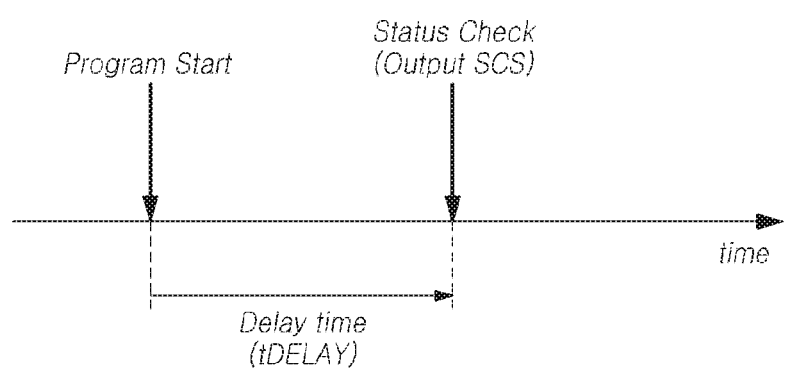
FIG. 4 is an example timing diagram for a program operation and a program status check operation of the memory system based on some embodiments of the disclosed technology.

FIG. 4 is an example timing diagram for a program operation and a program status check operation of the memory system 100 based on some embodiments of the disclosed technology.

After a predetermined delay time tDELAY from a point in time when a programming (writing) operation to the memory device 110 is started, the memory controller 120 may check whether the programming of the data to the memory device 110 is successfully completed. Such a check is referred to as a status check.

For a status check, the memory controller 120 may output a status check signal SCS to the memory device 110.

If the status check signal SCS is received, the memory device 110 may provide, to the memory controller 120, a response signal indicating whether the programming has been successfully completed or not.

Program times (e.g., time it takes to complete a program operations, tPGM) may vary among a plurality of memory cells MC in the memory device 110.

Such a variation in the program times can occur due to characteristic deviations among a plurality of word lines WL. Therefore, it is possible to group the plurality of memory cells MC based on grouping of word lines coupled to the memory cells MC such that the program times within one word line group may be the same and the program times vary from one word line group to another word line group depending on the characteristics of each word line group. Here, the characteristics of the groups of word lines WL may include signal transfer characteristics that can be determined based on time constants, resistances, and capacitances.

Figure 5:
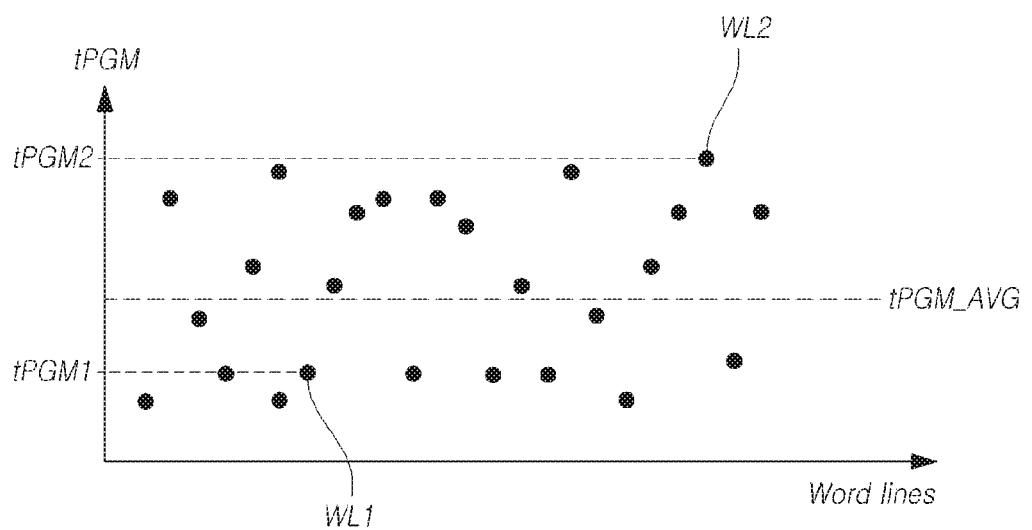
FIG. 5 shows an example of a distribution of program times that vary for each word line in the memory device.

FIG. 5 shows an example of distributions of program times tPGM that vary for each of the plurality of respective word lines WL.

In the memory device 110, due to the characteristic deviations among the plurality of word lines WL, program times tPGM may vary from word lines to word lines.

For example, a first program time tPGM1 required to write data in memory cells MC coupled to a first word line WL1 may be shorter than an average program time tPGM_AVG for all the word lines WL.

A second program time tPGM2 required to write data in memory cells MC coupled to a second word line WL2 may be longer than the average program time tPGM_AVG.

Therefore, the first program time tPGM1 is shorter than the second program time tPGM2.

As described above, because there are deviations in the program times tPGM depending on where the memory cells MC are or depending on where the word lines WL are, the status check signal SCS may be issued after the delay time tDELAY from the beginning of program (write) operations, and in some implementations the delay time tDELAY may be set to the average program time tPGM_AVG.

In other words, once a program operation starts, after the delay time tDELAY corresponding to the average program time tPGM_AVG, the memory controller 120 may start a status check by outputting the status check signal SCS.

Figure 6:
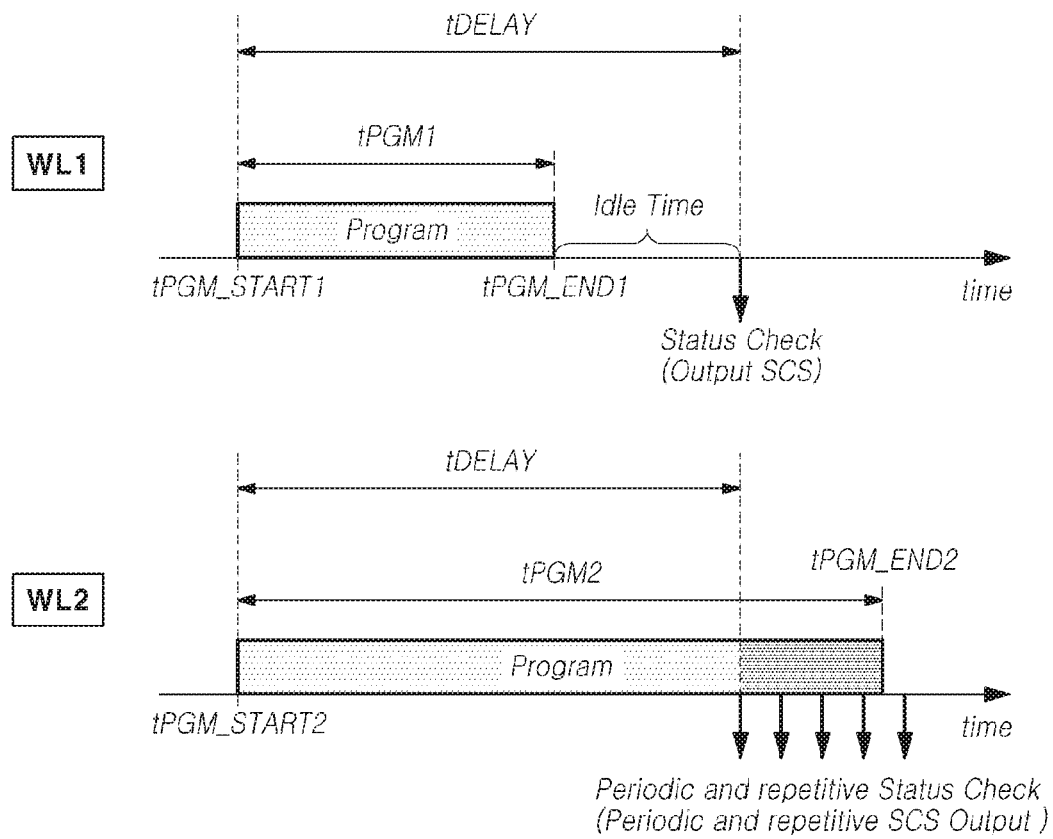
FIG. 6 shows an example of status check timings for a first word line and a second word line having different program.

FIG. 6 shows an example of status check timings for a first word line WL1 and a second word line WL2 having different program times.

In a situation where data is written in memory cells MC coupled to the first word line WL1, the memory controller 120 may start a status check by outputting the status check signal SCS when the delay time tDELAY corresponding to the average program time tPGM_AVG elapses since a first point in time tPGM_START1 at which a programming operation for the memory cells MC coupled to the first word line WL1 is started.

In a situation where data is written in memory cells MC coupled to the second word line WL2, the memory controller 120 may start a status check by outputting the status check signal SCS when the delay time tDELAY corresponding to the average program time tPGM_AVG elapses since a second point in time tPGM_START2 at which a programming operation for the memory cells MC coupled to the second word line WL2 is started.

In some cases, the first point in time tPGM_START1 and the second point in time tPGM_START2 may be different. In other cases, the first point in time tPGM_START1 and the second point in time tPGM_START2 may be the same. In this case, program completion timings will be different if corresponding two program operations are performed simultaneously.

A first program time tPGM1 corresponding to the first word line WL1 is a time duration from a first program start point tPGM_START1 to a first program end point tPGM_END1.

A second program time tPGM2 corresponding to the second word line WL2 is a time duration from a second program start point tPGM_START2 to a second program end point tPGM_END2.

As shown in FIG. 6, the first program time tPGM1 corresponding to the first word line WL1 is shorter than the average program time tPGM_AVG.

Without status check operations, the memory controller 120 cannot recognize that the programming for the memory cells MC coupled to the first word line WL1 has been completed.

Therefore, the memory controller 120 performs a status check by issuing a status check signal. In an implementation where status check signals are issued, some status check signals need to be waiting for an idle time until the delay time tDELAY has elapsed in a state in which programming for the memory cells MC corresponding to the first word line WL1 has been completed.

Even if programming for the memory cells MC coupled to the first word line WL1 has been completed, the memory controller 120 cannot immediately perform a status check to determine program completion, and such idle times, in aggregate, can have a significant impact on the performance of the memory system 100.

On the other hand, the second program time tPGM2 coupled to the second word line WL2 is longer than the average program time tPGM_AVG.

As discussed above, without status check operations, the memory controller 120 cannot recognize that the programming for the memory cells MC coupled to the second word line WL2 has not been completed.

Therefore, the memory controller 120 performs repetitive status checks by repeatedly outputting the status check signal SCS until a normal response signal indicating the completion of the programming operation.

As described above, even if programming for the memory cells MC coupled to the second word line WL2 has not been completed, the memory controller 120 unnecessarily performs repetitive status checks. Such unnecessary repetitive status checks may result in wasting system resources.

Figure 7:
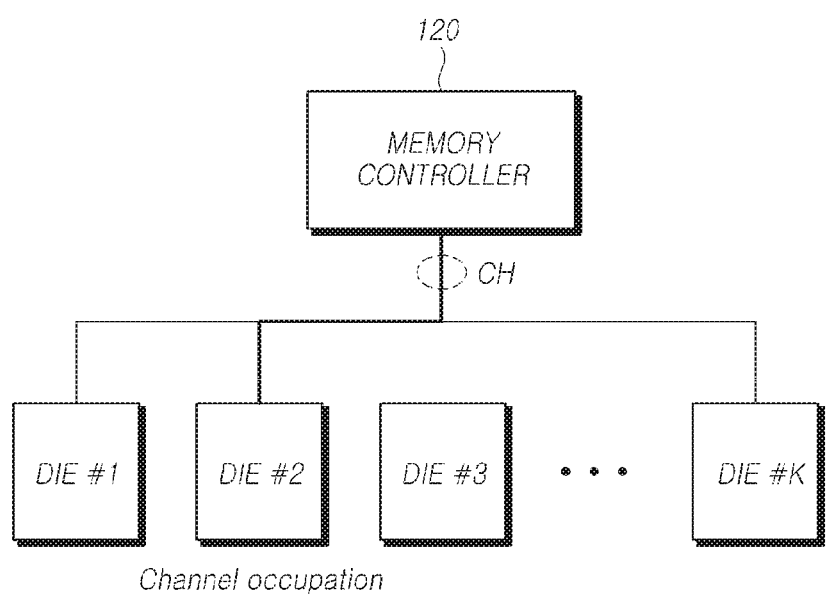
FIG. 7 shows an example of a channel between a plurality of memory dies of the memory device and a memory controller based on some embodiments of the disclosed technology.

FIG. 7 shows an example of a channel between a plurality of memory dies in the memory device 110 and the memory controller 120 based on some embodiments of the disclosed technology.

In an implementation, the memory device 110 may include a plurality of memory dies DIE #1 to DIE #K (K is a natural number of 2 or greater).

The memory controller 120 may communicate with the plurality of memory dies DIE #1 to DIE #K through one channel CH.

In this case, when the status check signal SCS is outputted from the memory controller 120 to one of the memory dies (e.g., second memory die DIE #2), the channel CH may be occupied by the corresponding memory die (e.g., second memory die DIE #2).

The relationship between such a channel occupation and the unnecessary repetitive status check operations of FIG. 6 are as follows. It is assumed that the second word line WL2 of FIG. 6 and the memory cells MC coupled thereto are included in the second memory die DIE #2.

As described above, in a situation where the memory controller 120 unnecessarily performs repetitive status checks even though the programming has not been completed, the channel is not available for the other memory dies DIE #1, DIE #3, . . . and DIE #K since they share the same channel CH, thereby degrading the entire performance of the memory system 100.

Some embodiments of the disclosed technology provide a memory system that can avoid long idle time on the system bus during program operations by grouping memory devices on a program time (tPRG) basis. In some embodiments of the disclosed technology, such long idle time can be avoided by using an adaptive status check timing control method.

Figure 8:
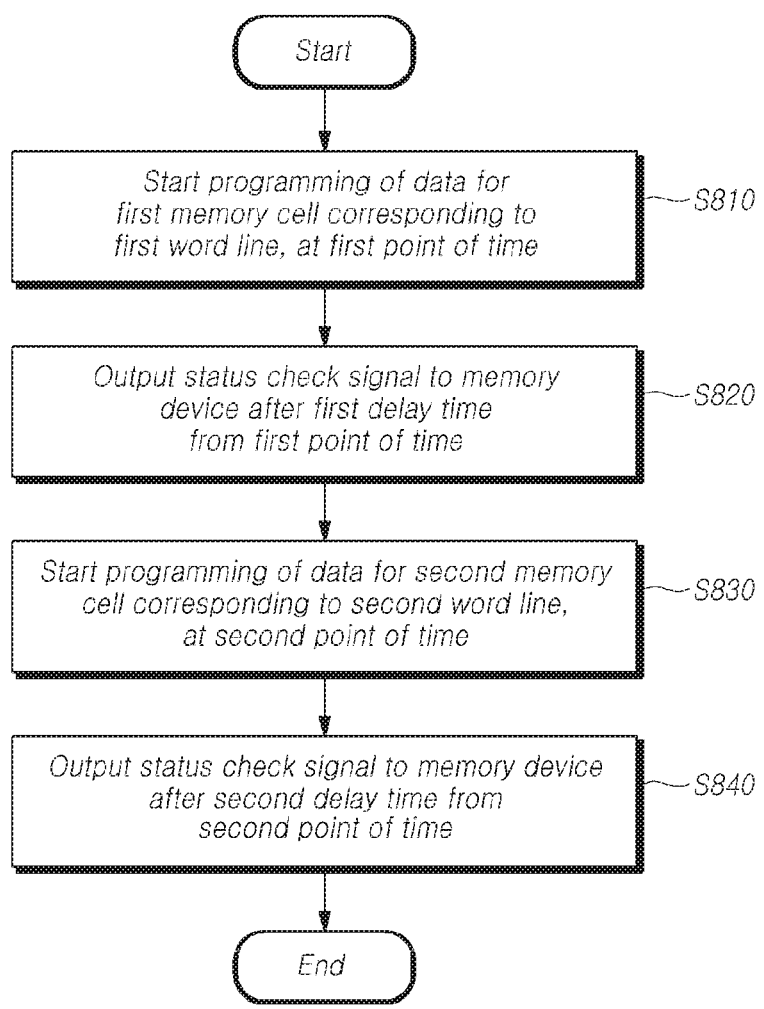
FIG. 8 is a flow chart illustrating an example of a method for operating the memory controller based on some embodiments of the disclosed technology.
Figure 9:
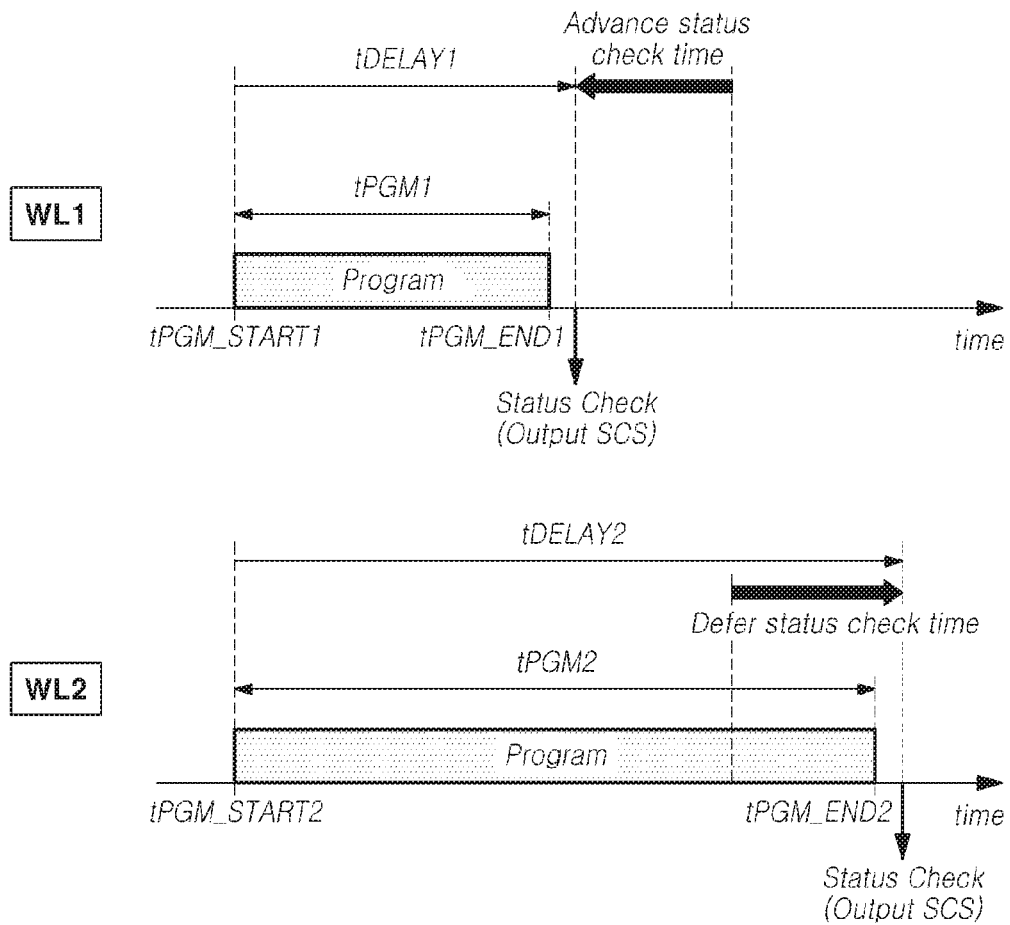
FIG. 9 shows an example of an adaptive status check timings control of the memory controller based on some embodiments of the disclosed technology.

FIG. 8 is a flow chart illustrating an example of a method for operating the memory controller 120 based on some embodiments of the disclosed technology. FIG. 9 shows an example of an adaptive status check timing control of the memory controller 120 based on some embodiments of the disclosed technology.

In some embodiments of the disclosed technology, the memory controller 120 may perform an adaptive status check timing control capable of preventing a performance deterioration or a load increase in relation to the status check operation.

To this end, the method for operating the memory controller 120 may include: starting a program operation for first memory cells MC coupled to a first word line WL1 among a plurality of word lines WL in the memory device 110, at a first point in time tPGM_START1 (S810); outputting the status check signal SCS to the memory device 110 after a first delay time tDELAY1 from the first point in time tPGM_START1 (S820); starting a program operation for second memory cells MC coupled to a second word line WL2 different from the first word line WL1 among the plurality of word lines WL, at a second point in time tPGM_START2 (S830); and outputting the status check signal SCS to the memory device 110 after a second delay time tDELAY2, which is different from the first delay time tDELAY1, from the second point in time tPGM_START2 (S840).

As shown in FIG. 9, a first program time tPGM1 required to write data in the first memory cells MC coupled to the first word line WL1 and a second program time tPGM2 required to write data in the second memory cells MC coupled to the second word line WL2 may be different from each other.

For example, as shown in FIG. 9, the second program time tPGM2 may be longer than the first program time tPGM1. In this case, the second delay time tDELAY2 may be longer than the first delay time tDELAY1.

As shown in FIG. 9, the first word line WL1 which has the relatively short first program time tPGM1, the corresponding status check timing is set to an earlier timing than an average statue check timing, and thus the first delay time tDELAY1 has a shorter time duration than the average delay time and the status check operation may be performed without wasting unnecessary idle time.

Conversely, since the second word line WL2 has the relatively long second program time tPGM2, the corresponding status check timing is set to a later timing than the average status check timing, and thus the second delay time tDELAY2 has a longer time duration than the average delay time and unnecessary repetitive status check operations may be prevented and a channel occupation time may be shortened.

While FIG. 8 illustrates that the step S810 and the step S820 are performed prior to the step S830 and the step S840, it is to be noted that the step S810 and the step S820 may be performed after the step S830 and the step S840.

The above-described adaptive status check timing control may be performed by the control circuit 123 in the memory controller 120.

Namely, the control circuit 123 in the memory controller 120 may output the status check signal SCS to the memory device 110 when the first delay time tDELAY1 elapses since the first point in time tPGM_START1 at which a program (write) operation for the first memory cells MC coupled to the first word line WL1, among the plurality of word lines WL, is started, and may output the status check signal SCS to the memory device 110 when the second delay time tDELAY2 different from the first delay time tDELAY1 elapses since the second point of time tPGM_START2 at which programming of data for the second memory cells MC corresponding to the second word line WL2 different from the first word line WL1, among the plurality of word lines WL, is started.

The processor 124 in the control circuit 123 included in the memory controller 120 may perform status check based on the adaptive status check timing control scheme by executing firmware loaded in the working memory 125.

The memory device 110 implemented based on some embodiments of the disclosed technology may include a plurality of memory cells MC and a plurality of word lines WL and a plurality of bit lines BL arranged in rows and columns and coupled to the plurality of memory cells MC.

The plurality of word lines WL may include the first word line WL1 and the second word line WL2.

The first delay time tDELAY1 is defined as the time it takes for the status check signal SCS to be issued by the memory controller 120 from the first point in time tPGM_START1 at which a program operation for the first memory cells MC coupled to the first word line WL1 is started. The second delay time tDELAY2 is defined as the time it takes for the status check signal SCS to be issued by the memory controller 120 from the second point in time tPGM_START2 at which a program operation for the second memory cells MC coupled to the second word line WL2 is started. The first delay time tDELAY1 may be different from the second delay time tDELAY2.

As described above, the first program time tPGM1 required to write data in the first memory cells MC coupled to the first word line WL1 and the second program time tPGM2 required to write data in the second memory cells MC coupled to the second word line WL2 may be different from each other.

For example, the second program time tPGM2 may be longer than the first program time tPGM1, and in this case, the second delay time tDELAY2 may be longer than the first delay time tDELAY1.

For instance, the first word line WL1 and the second word line WL2 may be disposed in the same memory block among the plurality of memory blocks BLK1 to BLKz.

As another instance, the first word line WL1 and the second word line WL2 may be disposed in different memory blocks, respectively, arranged in different locations.

In an implementation, the first program time tPGM1 and/or the second program time tPGM2 may be a fixed value. In another implementation, the first program time tPGM1 and/or the second program time tPGM2 may be a value that is adjustable depending on the operation time of the memory device 110. As an example, the operation time may include program time tPGM, and this is dependent on the time it takes to drive a word line to a predetermined program voltage. The first delay time tDELAY1 and/or the second delay time tDELAY2 may be a fixed value, or may be a value changed depending on a change in the first program time tPGM1 and/or the second program time tPGM2.

The adaptive status check timing control scheme may be implemented by setting a delay time tDELAY for status check based on a program time tPGM. The adaptive status check timing control scheme may set a longer delay time for memory cells having a longer program time and set a shorter delay time for memory cells having a shorter program time.

In some implementations, the memory controller 120 may adaptively and individually control the length of a delay time tDELAY for each of the plurality of word lines WL or each of the plurality of memory cells MC in the memory device 110. Such a control scheme is referred to as an individual control scheme.

The memory controller 120 implemented based on some embodiments of the disclosed technology may perform the adaptive status check timing control using a group control scheme instead of the individual control scheme in order to further improve control efficiency.

As an example, the group control scheme includes grouping the plurality of word lines WL into a plurality of word line groups and adaptively controlling the length of a delay time tDELAY for each of word line groups.

Hereinbelow, the adaptive status check timing control method of the group control scheme in accordance with the embodiments will be described.

Figure 10:
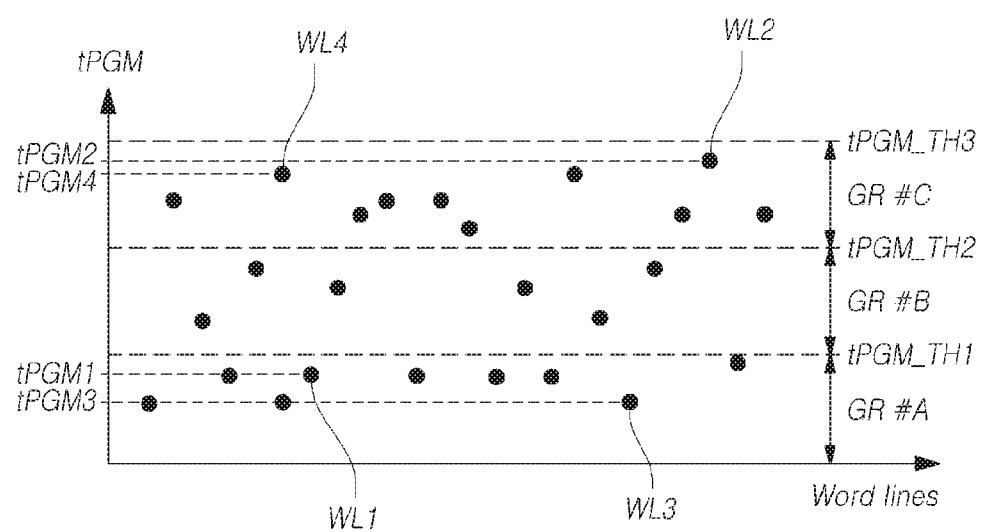
FIG. 10 shows an example of a distribution of program times that vary for each word line and an example of word line grouping based on the distribution of program times.

FIG. 10 shows an example of a distribution of program times tPGM that vary for each word line an example of word line grouping based on the distribution of program times.

As described above, program times tPGM required for data to be written in memory cells MC coupled to a plurality of respective word lines WL included in the memory device 110 vary from word line to word line.

Therefore, as illustrated in FIG. 10, the program times tPGM coupled to the plurality of respective word lines WL included in the memory device 110 may have a certain distribution.

As can be seen from the distribution diagram illustrated in FIG. 10 regarding the program times tPGM for the respective word lines WL, some word lines have the same or similar program time tPGM, and thus the plurality of word lines WL may be grouped into different word line groups GR #A, GR #B and GR #C based on the program times tPGM.

For example, word lines WL coupled to memory cells MC having program times tPGM shorter than a first threshold value tPGM_TH1 may be grouped into a first word line group GR #A. Word lines WL coupled to memory cells MC having program times tPGM equal to or longer than the first threshold value tPGM_TH1 and shorter than a second threshold value tPGM_TH2 may be grouped into a second word line group GR #B. Word lines WL coupled to memory cells MC having program times tPGM equal to or longer than the second threshold value tPGM_TH2 may be grouped into a third word line group GR #C. Alternatively, word lines WL coupled to memory cells MC having program times tPGM equal to or longer than the second threshold value tPGM_TH2 and shorter than a third threshold value tPGM_TH3 may be grouped into a third word line group GR #C.

The plurality of word lines WL included in the memory device 110 may be grouped into a plurality of word line groups (e.g., three word line groups GR #A, GR #B and GR #C as shown in FIG. 10). As for the example shown in FIG. 10, the three word line groups GR #A, GR #B and GR #C may be determined based on the two threshold values tPGM_TH1 and tPGM_TH2 or the three threshold values tPGM_TH1, tPGM_TH2 and tPGM_TH3. The word lines can be grouped into any number of word line groups (e.g., 2 or 4 or greater).

In the following example, it is assumed that a first word line WL1 is included in the first word line group GR #A and a second word line WL2 is included in the third word line group GR #C. Further, it is assumed that a third word line WL3 is included in the first word line group GR #A and a fourth word line WL4 is included in the third word line group GR #C.

Figure 11:
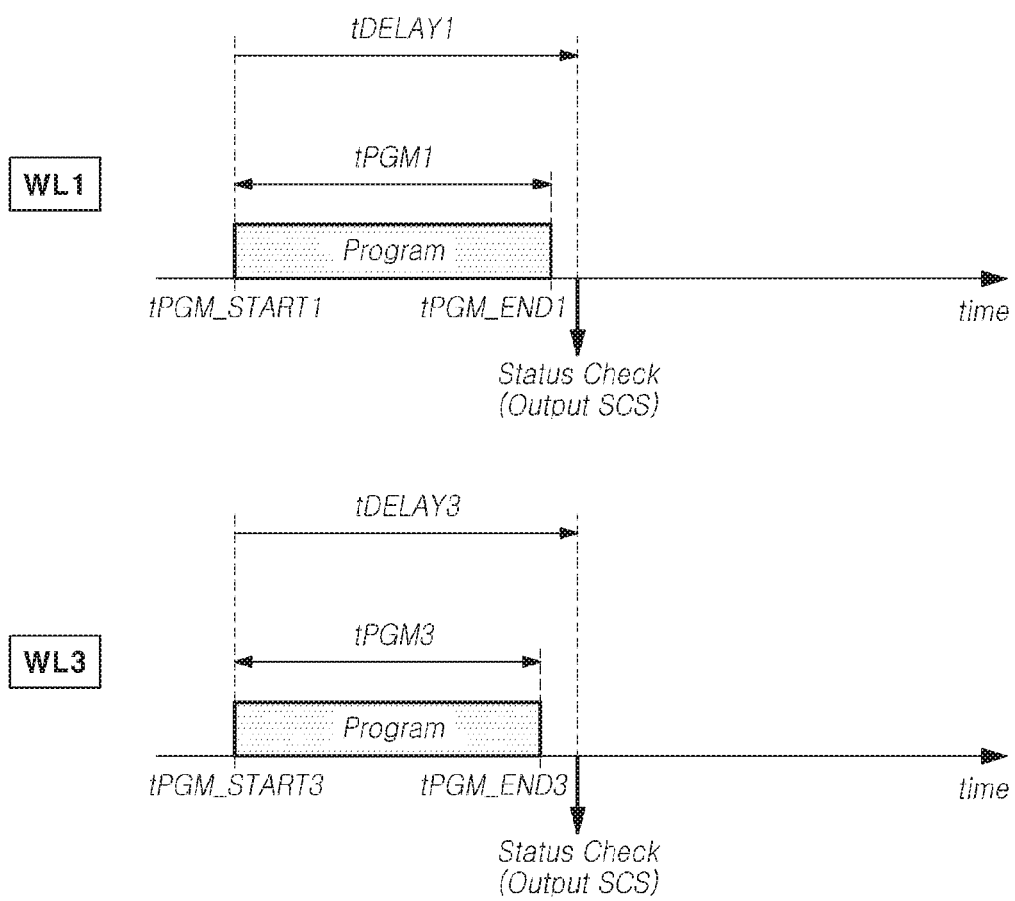
FIG. 11 shows an example of status check timing for first and third word lines included in a first word line group in the memory system based on some embodiments of the disclosed technology.
Figure 12:
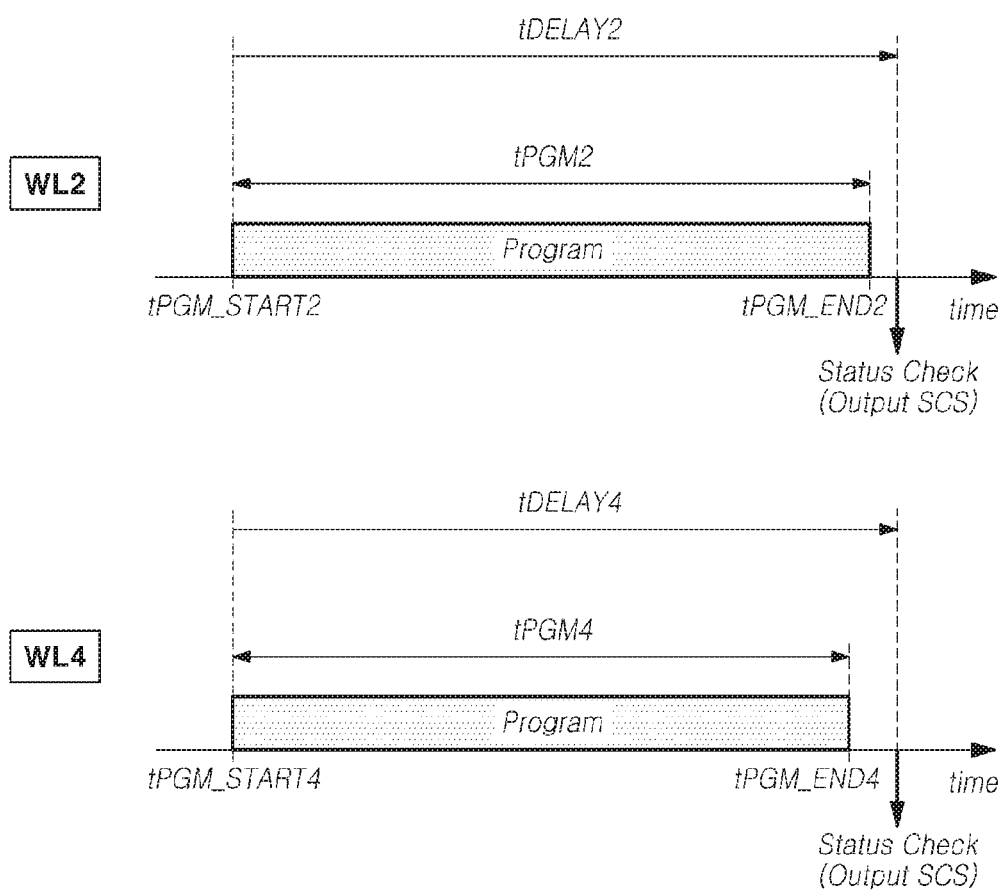
FIG. 12 shows an example of status check timings for second and fourth word lines included in a third word line group in the memory system based on some embodiments of the disclosed technology.

FIG. 11 shows an example of status check timing for the first word line WL1 and the third word line WL3 included in the first word line group GR #A in the memory system 100 based on some embodiments of the disclosed technology. FIG. 12 shows an example of status check timings for the second word line WL2 and the fourth word line WL4 included in the third word line group GR #C in the memory system 100 based on some embodiments of the disclosed technology.

As shown in FIG. 11, the memory controller 120 may output the status check signal SCS when a third delay time tDELAY3 elapses since a third point of time tPGM_START3 at which programming of data for third memory cells MC coupled to the third word line WL3 is started.

The third delay time tDELAY3 may correspond to the first delay time tDELAY1.

In the case of the group control scheme, the third delay time tDELAY3 may be the same value as the first delay time tDELAY1. In the case of the individual control scheme, the third delay time tDELAY3 may be the same as or different from the first delay time tDELAY1.

As shown in FIG. 12, the memory controller 120 may output the status check signal SCS when a fourth delay time tDELAY4 different from the third delay time tDELAY3 elapses from a fourth point of time tPGM_START4 at which programming of data for fourth memory cells MC corresponding to the fourth word line WL4 is started.

The fourth delay time tDELAY4 may correspond to the second delay time tDELAY2.

In the case of the group control scheme, the fourth delay time tDELAY4 may be the same value as the second delay time tDELAY2. In the case of the individual control scheme, the fourth delay time tDELAY4 may be the same as or different from the second delay time tDELAY2.

As shown in FIGS. 11 and 12, a third program time tPGM3 required to write data in the third memory cells MC coupled to the third word line WL3 and a fourth program time tPGM4 required to write data in the fourth memory cells MC coupled to the fourth word line WL4 may be different from each other.

As shown in FIGS. 11 and 12, the difference between the first program time tPGM1 and the third program time tPGM3 may be shorter than the difference between the first program time tPGM1 and the second program time tPGM2, may be shorter than the difference between the first program time tPGM1 and the fourth program time tPGM4, may be shorter than the difference between the third program time tPGM3 and the second program time tPGM2, and may be shorter than the difference between the third program time tPGM3 and the fourth program time tPGM4.

As shown in FIGS. 11 and 12, the difference between the second program time tPGM2 and the fourth program time tPGM4 may be shorter than the difference between the second program time tPGM2 and the first program time tPGM1, may be shorter than the difference between the second program time tPGM2 and the third program time tPGM3, may be shorter than the difference between the fourth program time tPGM4 and the first program time tPGM1, and may be shorter than the difference between the fourth program time tPGM4 and the third program time tPGM3.

Figure 13:
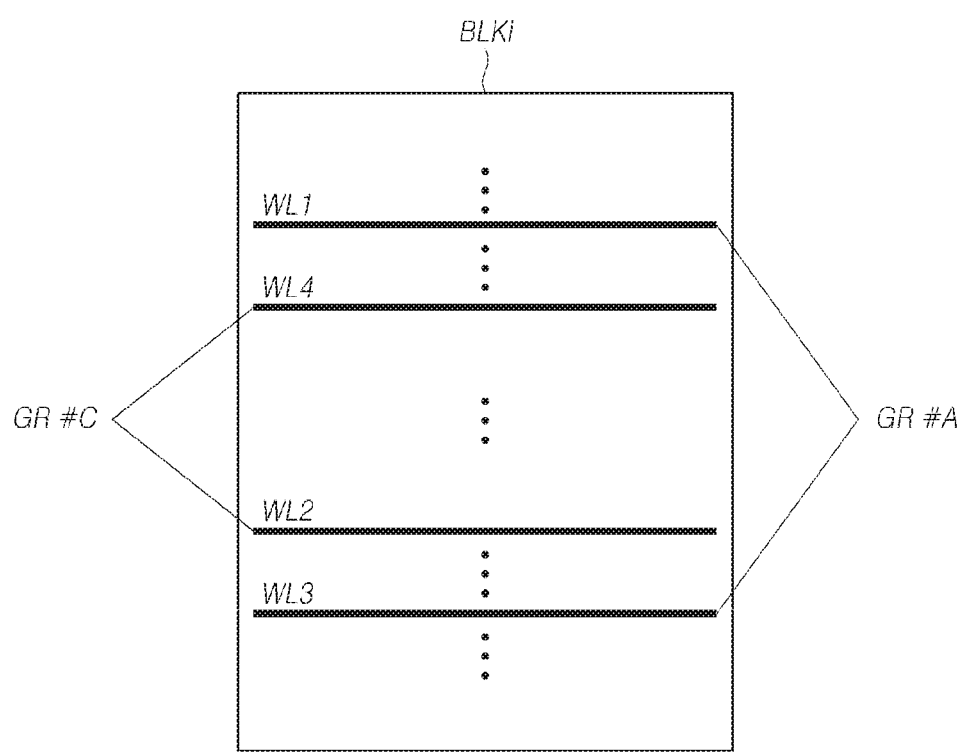
FIG. 13 shows an example of a memory block where word lines of the memory block are grouped into a plurality of word line groups based on some embodiments of the disclosed technology.

FIG. 13 shows an example of memory block where word lines of the memory block are grouped into a plurality of word line groups based on some embodiments of the disclosed technology.

Each of the plurality of memory blocks BLK1 to BLKz included in the memory device 110 may include at least two word lines groups GR #A, GR #B.

In this case, for example, a first word line WL1 and a third word line WL3, which have similar program times tPGM, may be included in the same first word line group GR #A, and a second word line WL2 and a fourth word line WL4, which have similar program times tPGM, may be included in the same third word line group GR #C may be disposed in one first memory block BLKi among the plurality of memory blocks BLK1 to BLKz.

Figure 14:
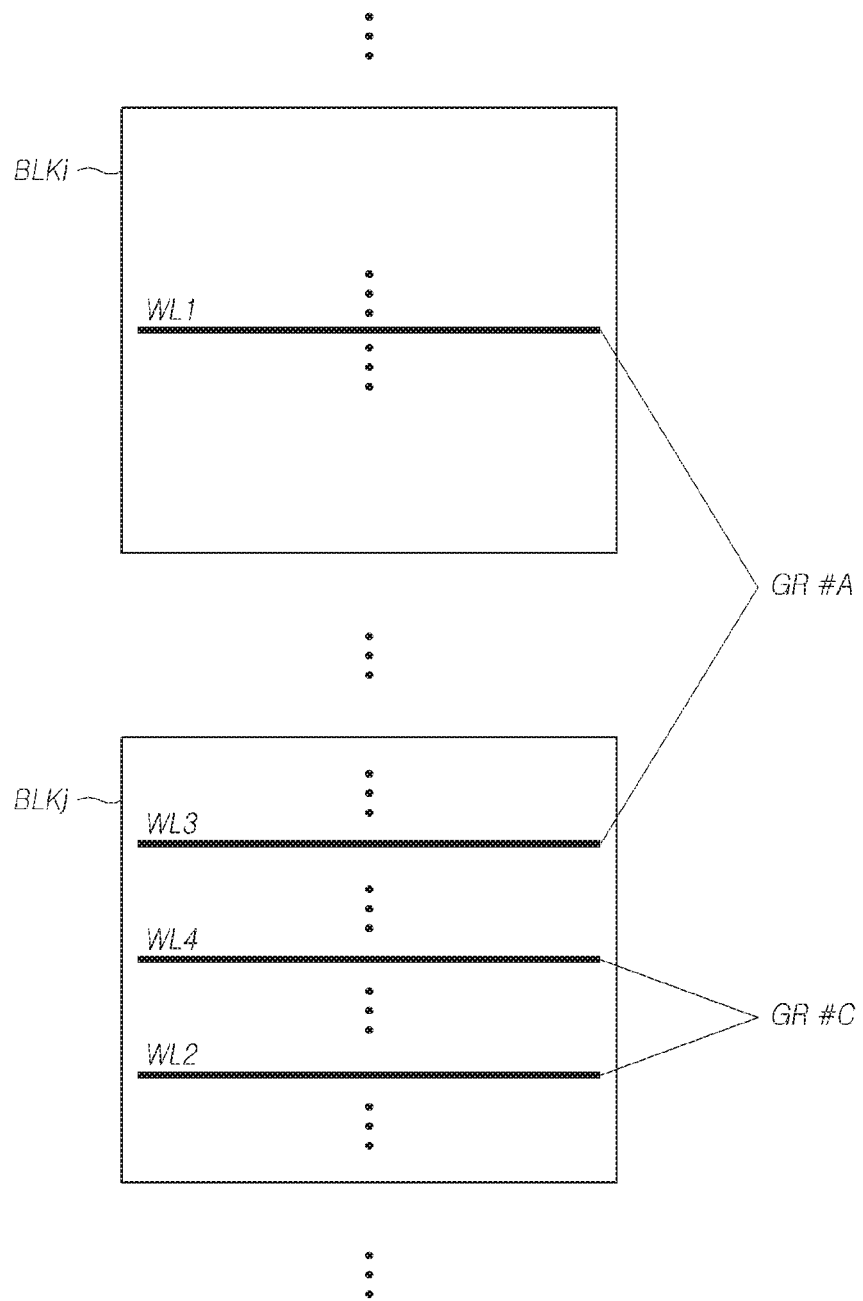
FIG. 14 shows an example of a plurality of memory blocks where word lines of the plurality of memory blocks are grouped into a plurality of word line groups based on some embodiments of the disclosed technology.

FIG. 14 shows an example of a plurality of memory blocks where word lines of the plurality of memory blocks are grouped into a plurality of word line groups based on some embodiments of the disclosed technology.

As shown in FIG. 14, all word lines WL included in the memory device 110 may be grouped into at least two word line groups GR #A, GR #B regardless of memory blocks.

In this case, for example, a first word line WL1 and a third word line WL3, which have similar program times tPGM, may be included in the same first word line group GR #A, the first word line WL1 may be disposed in a first memory block BLKi, and the third word line WL3 may be disposed in a second memory block BLKj different from the first memory block BLKi. Further, both of a second word line WL2 and a fourth word line WL4, which have similar program times tPGM, may be included in the same third word line group GR #C may be disposed in the second memory block BLKj.

Figure 15:
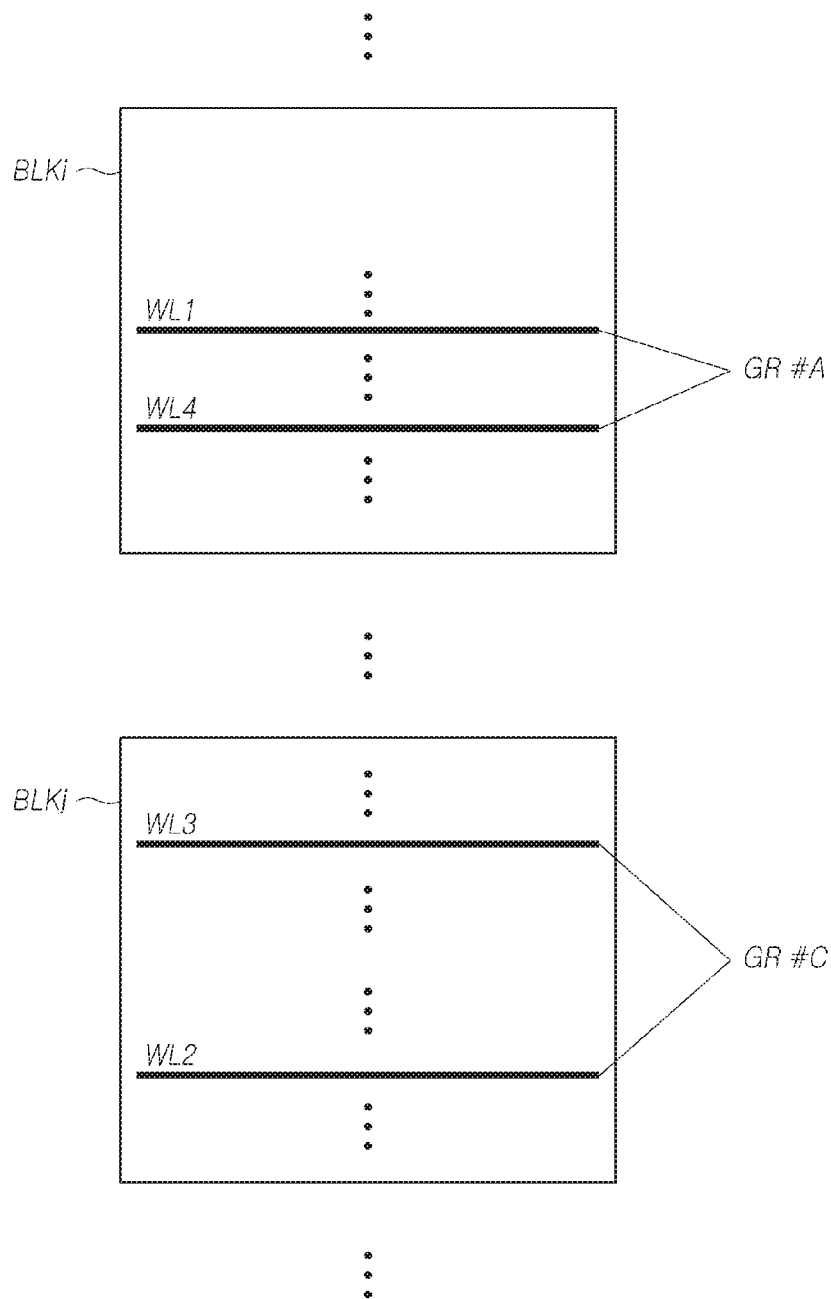
FIG. 15 shows an example of a plurality of memory blocks where word lines are grouped into a plurality of word line groups and word lines in each word line group are included in the same memory block.

FIG. 15 shows an example of a plurality of memory blocks where word lines are grouped into a plurality of word line groups and each word line group is included in a memory block.

As shown in FIG. 15, the plurality of memory blocks BLK1 to BLKz included in the memory device 110 may correspond to a plurality of word line groups GR #A, GR #B, respectively. In this case, the number of memory blocks may be the same as the number of word line groups.

In this case, for example, a first word line WL1 and a third word line WL3, which have similar program times tPGM, may be included in the same first word line group GR #A and may be disposed in a first memory block BLKi. Further, both of a second word line WL2 and a fourth word line WL4, which have similar program times tPGM, may be included in the same third word line group GR #C and may be disposed in a second memory block BLKj.

In this case, the first word line group GR #A may correspond to the first memory block BLKi. The third word line group GR #C may correspond to the second memory block BLKj.

The status check timing control method based on the group control scheme described above will be briefly described again with reference to FIGS. 16 and 17.

Figure 16:
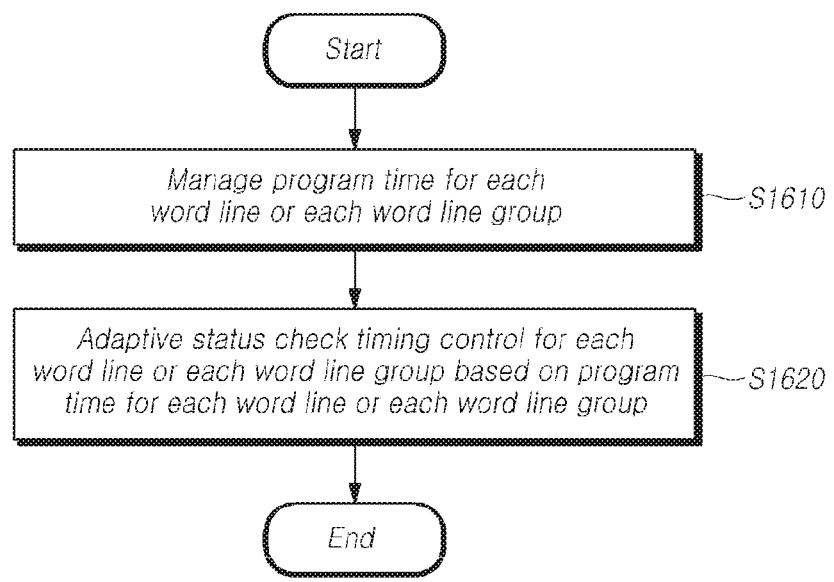
FIG. 16 is a flow chart illustrating an example of an operating method for an adaptive status check timing control for each word line or each word line group based on some embodiments of the disclosed technology.

FIG. 16 is a flow chart illustrating an example of an operating method for an adaptive status check timing control for each word line or each word line group based on some embodiments of the disclosed technology.

In an implementation, the operating method of the memory controller 120 for controlling the memory device 110 may include storing and managing a program time for each word line or each word line group in the memory device 110 (S1610), and independently controlling status check timing for checking whether programming of the memory device 110 is being performed or is ended, for each word line or each word line group, based on the program time for each word line or each word line group (S1620).

Figure 17:
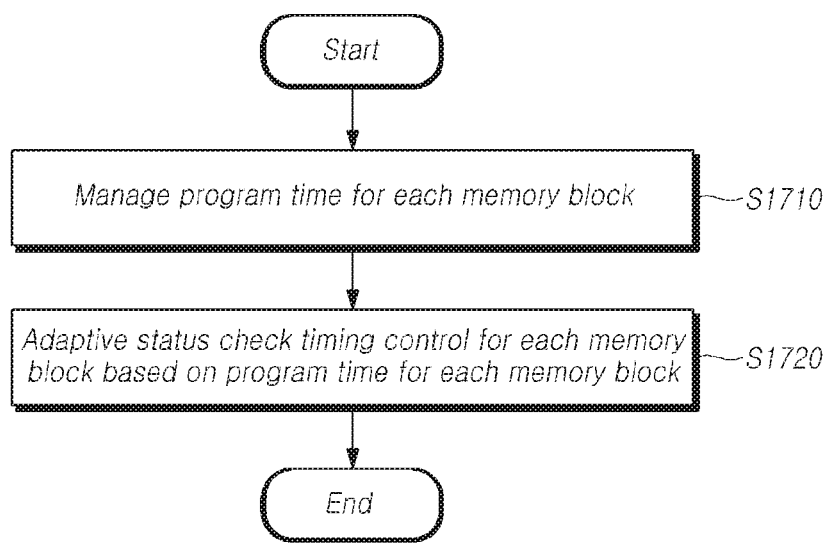
FIG. 17 is a flow chart illustrating an example of an operating method for an adaptive status check timing control for each memory block based on some embodiments of the disclosed technology.

FIG. 17 is a flow chart illustrating an example of an operating method for an adaptive status check timing control for each memory block based on some embodiments of the disclosed technology.

In an implementation, the operating method of the memory controller 120 for controlling the memory device 110 may include storing and managing a program time for each memory block in the memory device 110 (S1710), and independently controlling status check timing for checking whether programming of the memory device 110 is being performed or is ended, for each memory block, based on the program time for each memory block (S1720).

Figure 18:
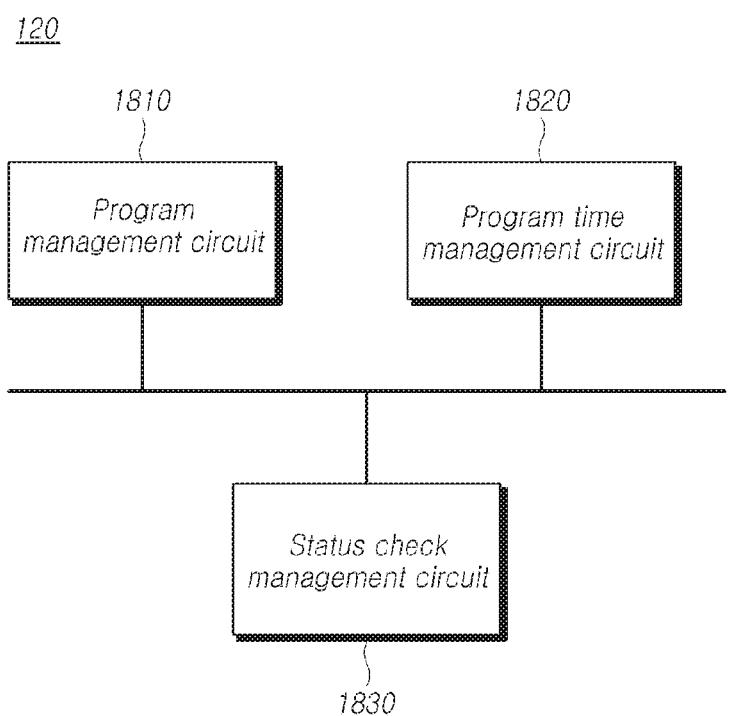
FIG. 18 shows an example of the memory controller based on some embodiments of the disclosed technology.

FIG. 18 shows an example of the memory controller 120 based on some embodiments of the disclosed technology.

In an implementation, the memory controller 120 may include a program management circuit 1810, a program time management circuit 1820 and a status check management circuit 1830.

The program management circuit 1810 may control a program operation for programming data in the memory cell array 210 in the memory device 110.

The program time management circuit 1820 may manage information on program times tPGM of data for the memory cells MC included in the memory cell array 210 in the memory device 110 and a distribution thereof.

The program time management circuit 1820 may store and manage the program times tPGM of data for the memory cells MC included in the memory cell array 210 in the memory device 110, by matching them with corresponding word lines WL.

Moreover, the program time management circuit 1820 may manage an average program time tPGM_AVG corresponding to an average value of the program times tPGM of data for the memory cells MC included in the memory cell array 210 in the memory device 110. The average program time tPGM_AVG may be an initially set value or may be a value that is calculated periodically or non-periodically in the case where a program time tPGM of data for memory cells MC is changed.

The status check management circuit 1830 may manage a delay time tDELAY by matching it with each word line, each word line group or each memory block, and may perform a status check to check whether programming is ended or not, based on the managed delay time tDELAY.

The program management circuit 1810, the program time management circuit 1820 and the status check management circuit 1830 described above may be an internal module of the processor 124.

The program management circuit 1810, the program time management circuit 1820 and the status check management circuit 1830 described above may be a software module, and may be realized in the form of a program in a firmware.

Figure 19:
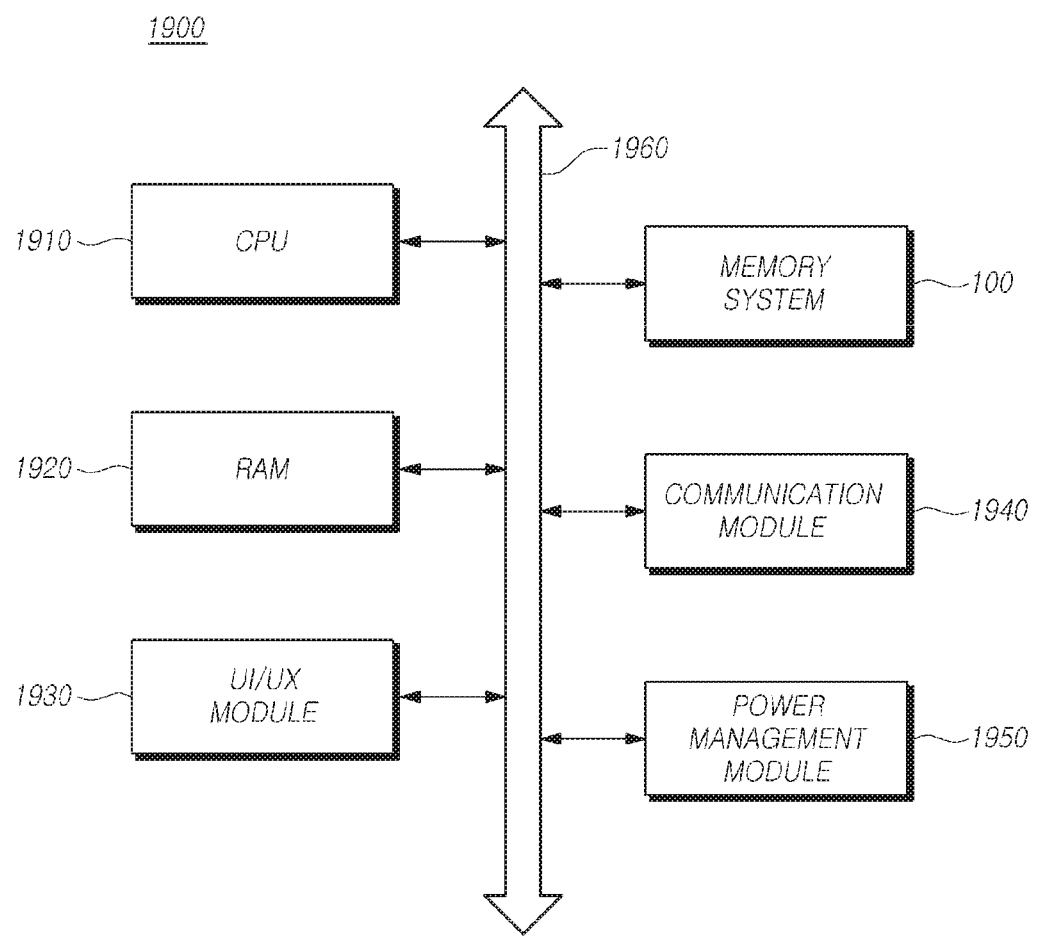
FIG. 19 shows an example of a computing system based on some embodiments of the disclosed technology.

FIG. 19 shows an example of a computing system 1900 based on some embodiments of the disclosed technology.

Referring to FIG. 19, the computing system 1900 in accordance with the embodiments may include a memory system 100, a central processing unit (CPU) 1910, a RAM 1920, a UI/UX (user interface/user experience) module 1930, a communication module 1940 based on at least one communication scheme and a power management module 1950 which are electrically coupled to a system bus 1960.

The computing system 1900 in accordance with the embodiments may include a PC (personal computer), a mobile terminal such as a smartphone and a tablet or various electronic devices.

The computing system 1900 in accordance with the embodiments may further include a battery for supplying an operating voltage, and may further include an application chipset, a graphic-related module, a camera image processor (CIS), a DRAM and so forth. Besides, it is obvious to those skilled in the art that the computing system 1900 may include other components.

The memory system 100 may include not only a device which stores data in a magnetic disk, such as a hard disk drive (HDD), but also a device which stores data in a nonvolatile memory, such as a solid state drive (SDD), a universal flash storage (UFS) device and an embedded MMC (eMMC) device. The nonvolatile memory may include a ROM (read only memory), a PROM (programmable ROM), an EPROM (electrically programmable ROM), an EEPROM (electrically erasable and programmable ROM), a flash memory, a PRAM (phase-change RAM), an MRAM (magnetic RAM), an RRAM (resistive RAM), and an FRAM (ferroelectric RAM). In addition, the memory system 100 may be realized into various types of storage devices, and may be mounted in various electronic devices.

The embodiments described above may provide the memory system 100, the memory device 110, the memory controller 120 and the operating method thereof, capable of efficiently managing a program (write) operation of data.

Also, the embodiments may provide the memory system 100, the memory device 110, the memory controller 120 and the operating method thereof, capable of efficiently performing a status check operation related with a program operation of data.

Further, the embodiments may provide the memory system 100, the memory device 110, the memory controller 120 and the operating method thereof, capable of effectively controlling a status check operation related with a program operation of data, in consideration of the characteristics of word lines in a memory device.

Moreover, the embodiments may provide the memory system 100, the memory device 110, the memory controller 120 and the operating method thereof, capable of causing a status check operation related with a program operation of data to be performed quickly.

In addition, the embodiments may provide the memory system 100, the memory device 110, the memory controller 120 and the operating method thereof, capable of preventing a status check operation related with a program operation of data from being unnecessarily performed repeatedly.

Although exemplary embodiments have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted by the appended claims and encompass all equivalents falling within the scope of the appended claims.

What is claimed is:

1. A memory system comprising:
a memory device including a plurality of memory cells arranged in an array coupled to a plurality of word lines and a plurality of bit lines; and
a memory controller configured to control the memory device,
wherein the plurality of word lines includes a first word line and a second word line,
wherein the memory controller is configured to issue a first status check signal to the memory device when a first delay time elapses since a first point in time at which a program operation for first memory cells coupled to the first word line is started, wherein the first status check signal is used to check as to whether the program operation associated with the first word line has been completed, and
wherein the memory controller is configured to issue a second status check signal to the memory device when a second delay time different from the first delay time elapses since a second point in time at which a program operation for second memory cells coupled to the second word line is started, wherein the second status check signal is used to check as to whether the program operation associated with the second word line has been completed.

2. The memory system according to claim 1, wherein a first program time for writing data in the first memory cells coupled to the first word line is different from a second program time for writing data in the second memory cells coupled to the second word line.

3. The memory system according to claim 2, wherein the second program time is longer than the first program time, and the second delay time is longer than the first delay time.

4. The memory system according to claim 1, wherein the first word line and the second word line are disposed in the same memory block.

5. The memory system according to claim 1, wherein the first word line and the second word line are disposed in different memory blocks arranged in different locations in the memory device.

6. The memory system according to claim 1,
wherein the plurality of word lines further includes a third word line and a fourth word line,
wherein the memory controller outputs the status check signal when a third delay time elapses since a third point in time at which a program operation for third memory cells coupled to the third word line is started,
wherein the memory controller outputs the status check signal when a fourth delay time different from the third delay time elapses since a fourth point in time at which a program operation for fourth memory cells coupled to the fourth word line is started, and
wherein the third delay time corresponds to the first delay time, and the fourth delay time corresponds to the second delay time.

7. The memory system according to claim 6,
wherein a third program time for writing data in the third memory cells coupled to the third word line and a fourth program time for writing data in the fourth memory cells coupled to the fourth word line are different from each other, wherein a difference between the first program time and the third program time is smaller than a difference between the first program time and the second program time, and wherein a difference between the second program time and the fourth program time is smaller than a difference between the second program time and the third program time.

8. The memory system according to claim 6, wherein the first word line, the second word line, the third word line and the fourth word line are disposed in the same memory block.

9. The memory system according to claim 6, wherein the first word line and the third word line are disposed in a first memory block, and wherein the second word line and the fourth word line are disposed in a second memory block of which a position is different from that of the first memory block.

10. The memory system according to claim 1, wherein the memory device includes a plurality of memory dies, wherein the memory controller and the plurality of memory dies are coupled through one channel, and wherein, when the status check signal is outputted from the memory controller to one memory die among the plurality of memory dies, the channel is occupied by the one memory die.

11. A memory controller comprising:

a host interface configured to communicate with a host;

a memory interface configured to communicate with a memory device including a plurality of memory cells arranged in an array coupled to a plurality of word lines and a plurality of bit lines; and a control circuit configured to control the memory device, wherein the control circuit is configured to issue a first status check signal issued when a first delay time elapses since a first point in time at which a program operation for first memory cells coupled to a first word line among the plurality of word lines is started; and wherein the control circuit is configured to issue a second status check signal issued when a second delay time different from the first delay time elapses since a second point in time at which a program operation for second memory cells coupled to a second word line different from the first word line among the plurality of word lines is started.

12. The memory controller according to claim 11, wherein a first program time for writing data in the first memory cells coupled to the first word line and a second program time for writing data in the second memory cells coupled to the second word line are different from each other.

13. The memory controller according to claim 12, wherein the second program time is longer than the first program time, and the second delay time is longer than the first delay time.

14. The memory controller according to claim 11, wherein the plurality of word lines further includes a third word line and a fourth word line, wherein the control circuit outputs the status check signal when a third delay time elapses since a third point in time at which a program operation for third memory cells coupled to the third word line is started, wherein the control circuit outputs the status check signal when a fourth delay time different from the third delay time elapses since a fourth point in time at which a program operation for fourth memory cells coupled to the fourth word line is started, and wherein the third delay time corresponds to the first delay time, and the fourth delay time corresponds to the second delay time.

15. The memory controller according to claim 14, wherein a third program time for writing data in the third memory cells coupled to the third word line and a fourth program time for writing data in the fourth memory cells coupled to the fourth word line are different from each other, wherein a difference between the first program time and the third program time is smaller than a difference between the first program time and the second program time, and wherein a difference between the second program time and the fourth program time is smaller than a difference between the second program time and the third program time.

16. The memory controller according to claim 14, wherein the first word line, the second word line, the third word line and the fourth word line are disposed in the same first memory block.

17. The memory controller according to claim 14, wherein the first word line and the third word line are disposed in a first memory block, and wherein the second word line and the fourth word line are disposed in a second memory block of which a position is different from that of the first memory block.

18. A memory device comprising:

a plurality of word lines and a plurality of bit lines arranged in rows and columns;

a plurality of memory cells coupled the plurality of word lines and the plurality of bit lines, wherein the plurality of word lines includes a first word line and a second word line, and wherein a first delay time from a point of time at which programming of data for first memory cells corresponding to the first word line is started to when a status check signal is received from a memory controller and a second delay time from a point of time at which programming of data for second memory cells corresponding to the second word line is started to when the status check signal is received from the memory controller are different from each other.

19. The memory device according to claim 18, wherein the first word line and the second word line are disposed in the same memory block.

20. The memory device according to claim 18, wherein the first word line and the second word line are disposed in memory blocks of which positions are different from each other.

* * * * *